US008227808B2

(12) United States Patent
Wan et al.

(10) Patent No.: US 8,227,808 B2
(45) Date of Patent: Jul. 24, 2012

(54) METHOD FOR MANUFACTURING THIN FILM TRANSISTOR (TFT) AND OLED DISPLAY HAVING TFTS MANUFACTURED BY THE SAME

(75) Inventors: Te-Chang Wan, Chu-Nan (TW); Yu-Chung Liu, Chu-Nan (TW); Te-Yu Lee, Chu-Nan (TW)

(73) Assignee: Chimei Innolux Corporation, Miao-Li County (TW)

( * ) Notice: Subject to any disclaimer, the term of this patent is extended or adjusted under 35 U.S.C. 154(b) by 897 days.

(21) Appl. No.: 12/277,041

(22) Filed: Nov. 24, 2008

(65) Prior Publication Data

US 2009/0146927 A1 Jun. 11, 2009

Related U.S. Application Data

(60) Provisional application No. 61/012,042, filed on Dec. 6, 2007.

(30) Foreign Application Priority Data

Apr. 21, 2008 (TW) ................................ 97114510 A

(51) Int. Cl.
*H01L 27/108* (2006.01)
(52) U.S. Cl. .................... 257/69; 257/350; 257/E29.293
(58) Field of Classification Search .................... 257/69, 257/70
See application file for complete search history.

(56) References Cited

U.S. PATENT DOCUMENTS 6,271,897 B1 * 8/2001 Ichikawa et al. ................ 257/59
6,498,369 B1 * 12/2002 Yamazaki et al. ............ 257/347

FOREIGN PATENT DOCUMENTS

| CN | 1619607 A | 5/2005 |
| CN | 1691353 A | 11/2005 |
| CN | 1801467 A | 7/2006 |

OTHER PUBLICATIONS

State Intellectual Property Office of the People's Republic of China, "Office Action", Mar. 27, 2012, China.

* cited by examiner

*Primary Examiner* — Chandra Chaudhari
(74) *Attorney, Agent, or Firm* — Morris Manning & Martin LLP; Tim Tingkang Xia, Esq.

(57) ABSTRACT

An organic light emitting diode (OLED) display and thin film transistor (TFT) manufacturing method thereof are disclosed. According to the present invention, poly-silicon layers for forming active areas of non-driving TFT (e.g. peripheral circuit TFT and switch TFT) and driving TFT used in the OLED display are respectively made by using standard laser crystallization method and non-laser crystallization method or low energy laser crystallization method. Therefore, the peripheral circuit TFT has excellent electrical performance such as high carrier mobility, while the OLED-driving TFT has good stability so that the resultant display can operate with improved luminance uniformity.

9 Claims, 9 Drawing Sheets

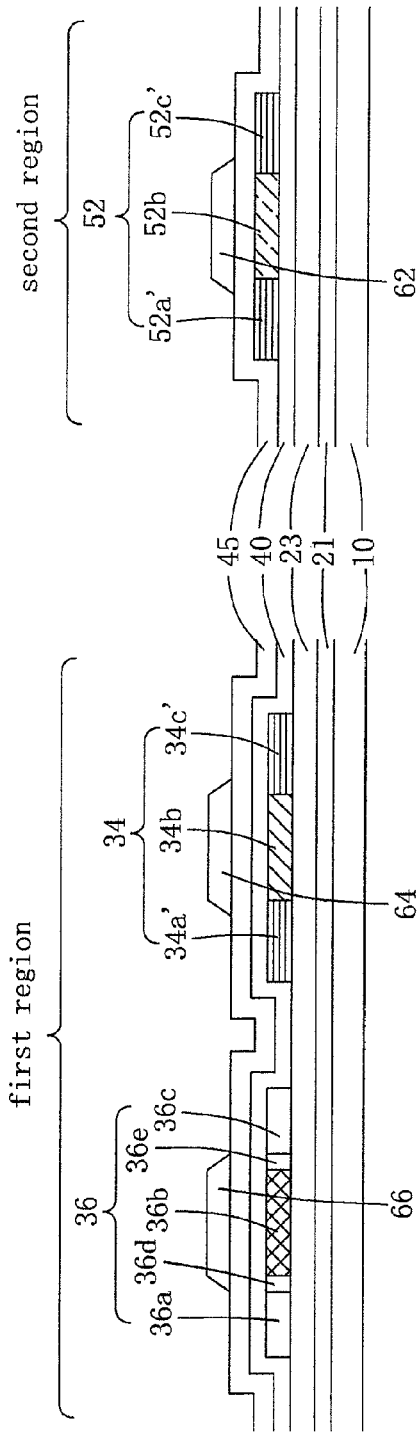
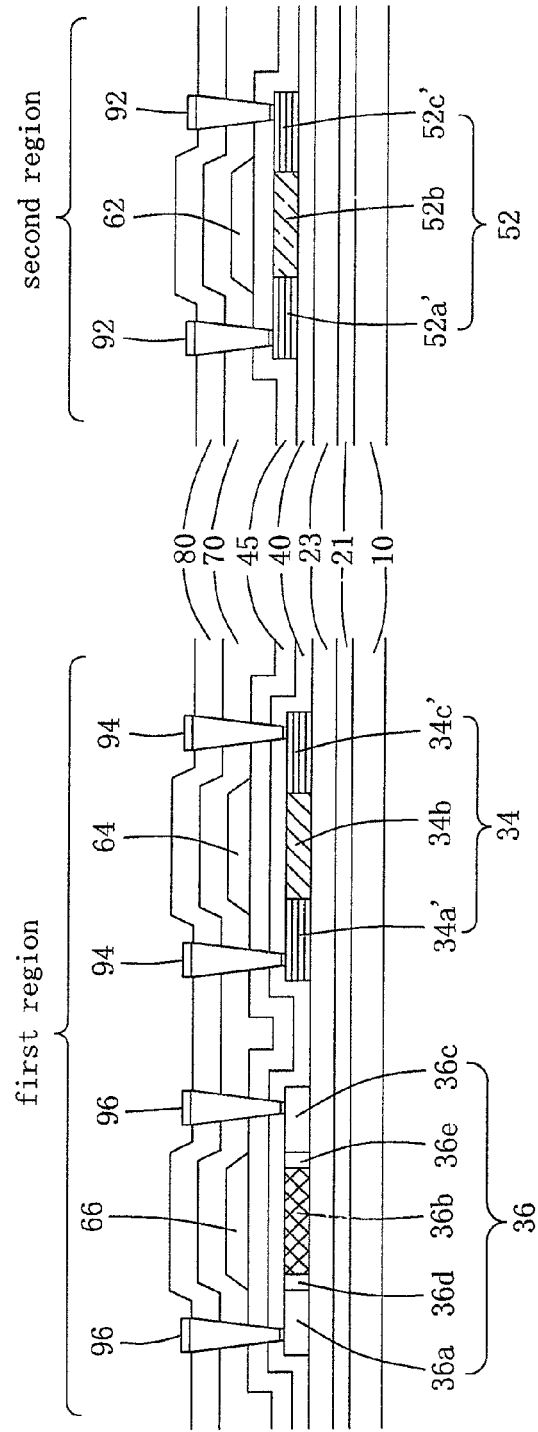

METHOD FOR MANUFACTURING THIN FILM TRANSISTOR (TFT) AND OLED DISPLAY HAVING TFTS MANUFACTURED BY THE SAME

TECHNICAL FIELD OF THE INVENTION

The present invention relates to an active matrix organic light emitting diode (AMOLED) display, more particularly, to a method for manufacturing various thin film transistors (TFTs) used in AMOLED displays and an AMOLED display having such TFTs.

BACKGROUND OF THE INVENTION

Organic light emitting diodes (OLEDs) have been widely utilized in displays. An AMOLED display uses a driving circuit to drive a light emitting element, i.e. an OLED. The AMOLED driving circuit uses TFTs, including a switch TFT and a driving TFT. The switch TFT, which is implemented by an N-type TFT (NTFT), is used for switching the ON/OFF state of a sub-pixel of the display. The driving TFT, which is implemented by a P-type TFT (PTFT), is used for driving the light emitting element (e.g. an OLED). In addition, a peripheral circuit of the AMOLED display also needs to use NTFT and PTFT. Conventionally, polycrystalline silicon (also referred to as poly-silicon) used in the TFTs of the AMOLED driving circuit and peripheral circuit is made by using a standard laser crystallization method to lead amorphous silicon growing on a glass substrate to crystallize into poly-silicon. Not like a silicon wafer used for manufacturing general transistors, the glass substrate suitable for a flat display cannot endure high temperatures, and therefore it is required to use a crystallization technique in which the temperature is lower than the melting temperature of glass substrate. Accordingly, the standard laser crystallization method is used. However, the standard laser crystallization technique has a problem. During triggering crystallization, output laser energy errors will result in a luminance non-uniform phenomenon called "mura" in the resultant display.

Further, the AMOLED driving TFT drives the OLED by an output current. The light emitting result is very sensitive to the variation in the driving current. A display area has a driving TFT matrix for a plurality of sub-pixels. If there are differences among the electrical properties of the respective driving TFTs, then light intensities of OLEDs in this area will have corresponding differences, resulting in visible distinction for human's vision.

After being made into a display, standard laser technique, current driving and the like factors regarding the driving TFT may result in stripe mura, thereby causing the yield of AMOLED products to be low. The present invention is to solve such a problem.

SUMMERY OF THE INVENTION

An objective of the present invention is to provide an OLED display TFT manufacturing method for manufacturing N-type and P-type peripheral circuit TFTs for an OLED display peripheral circuit as well as a switch TFT and driving TFT used in a driving circuit of a display area. By using the method of the present invention, the manufactured peripheral TFT, switch TFT and driving TFT are respectively provided with different properties to meet the use requirements thereof. The peripheral circuit TFT and switch TFT have excellent electrical performance such as high carrier mobility. The driving TFT has good stability so that the resultant display can operate with good luminance uniformity.

Another objective of the present invention is to provide an OLED display, which comprises a peripheral circuit portion and a display area portion. The peripheral circuit portion uses peripheral circuit TFTs. The display area portion has a plurality of sub-pixels, each sub-pixel contains a light emitting element, a driving TFT for driving the light emitting element and a switch TFT for switching a state of the sub-pixel. The peripheral circuit TFTs, switch TFT and driving TFT are respectively provided with properties meeting the use requirements thereof. The peripheral circuit TFT and switch TFT have excellent electrical performance such as high carrier mobility. The driving TFT has good stability so that the resultant display can operate with good luminance uniformity.

In accordance with an aspect of the present invention, an OLED display TFT manufacturing method comprises steps of providing a substrate, the substrate having a first region and a second region; forming a buffer layer on the substrate; forming a first poly-silicon layer on the buffer layer by a first crystallization process; patterning the first poly-silicon layer to form active areas of first TFTs; forming a first insulating layer; forming a second poly-silicon layer on the first insulating layer by a second crystallization process different from the first second crystallization process; patterning the second poly-silicon layer to form an active area of a second TFT; forming a second insulating layer; and respectively forming gates of the first TFTs and second TFT on the second insulating layer.

In accordance with another aspect of the present invention, an OLED display includes a peripheral circuit portion and a display area portion. The display area portion has a plurality of sub-pixels. Each sub-pixel has a light emitting element, a driving TFT for driving the light emitting element and a switch TFT. The OLED display comprises a substrate, first TFTs formed on the substrate. Each first TFT has a first buffer layer formed on the substrate, an active area made by a first poly-silicon layer provided on the buffer layer, a first gate insulation layer covering the active area and a first gate provided on the first gate insulation layer. The OLED display further comprises a second TFT formed on the substrate. The second TFT has a second buffer layer formed on the substrate, an active area made by a second poly-silicon layer provided on the buffer layer, a second gate insulation layer covering the active area and a second gate provided on the second gate insulation layer. The first poly-silicon layer and the second poly-silicon layer have different grain properties. In addition, the first gate insulation layer and the second gate insulation layer have different thicknesses.

BRIEF DESCRIPTION OF THE DRAWINGS

The present invention will be described in detail in conjunction with the appending drawings, in which:

FIG. 3 to FIG. 12 are sectional schematic illustrations showing respective steps of an OLED display TFT manufacturing method in accordance with an embodiment of the present invention;

DETAILED DESCRIPTION OF THE INVENTION

Figure 1:
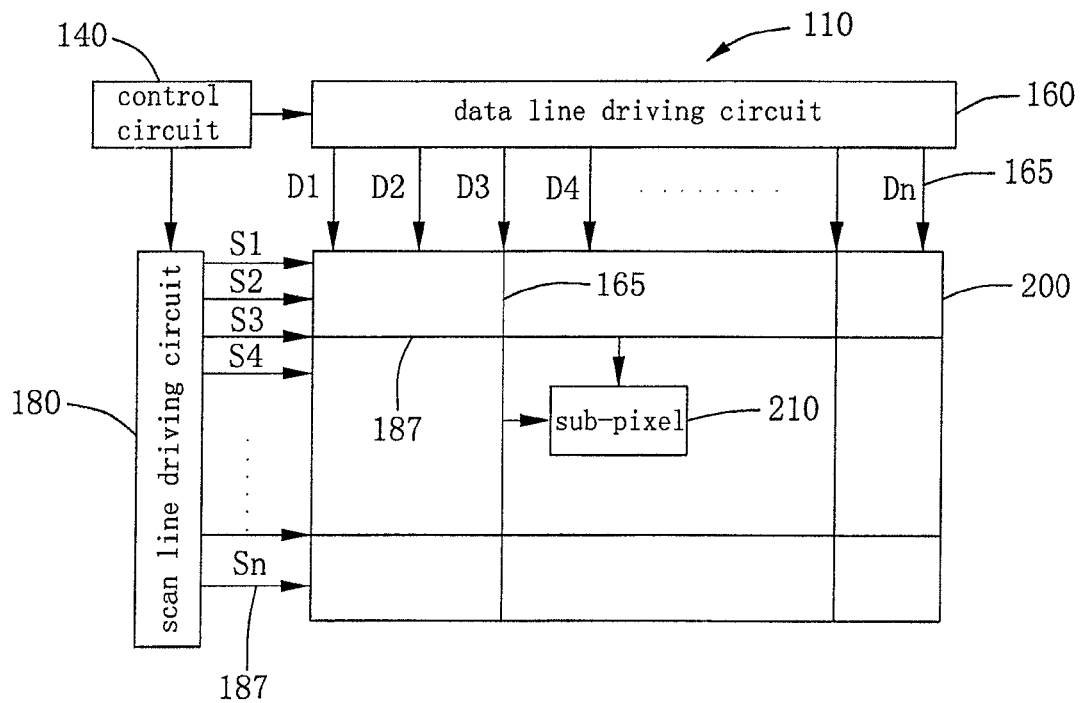
FIG. 1 is a schematic diagram showing a basic circuit structure of an AMOLED display.

FIG. 1 is a schematic diagram showing a basic circuit structure of an AMOLED display 110. The OLED display 110 includes a control circuit 140, a data line driving circuit 160, a scan line driving circuit 180 and a display panel 200. The display panel 200 has a plurality of sub-pixels 210. Each sub-pixel 210 is connected with a data line (D1-Dn) 165 and a scan line (S1-Sn) 187 so as to form a matrix. The sub-pixel 210 receives an image data signal from the data line driving circuit 160 via the data line 165 and receives a switch/address signal from the scan line driving circuit 180 via the scan line 187. The data line driving circuit 160 and the scan line driving line circuit 180 are controlled by the control circuit 140.

Figure 2:
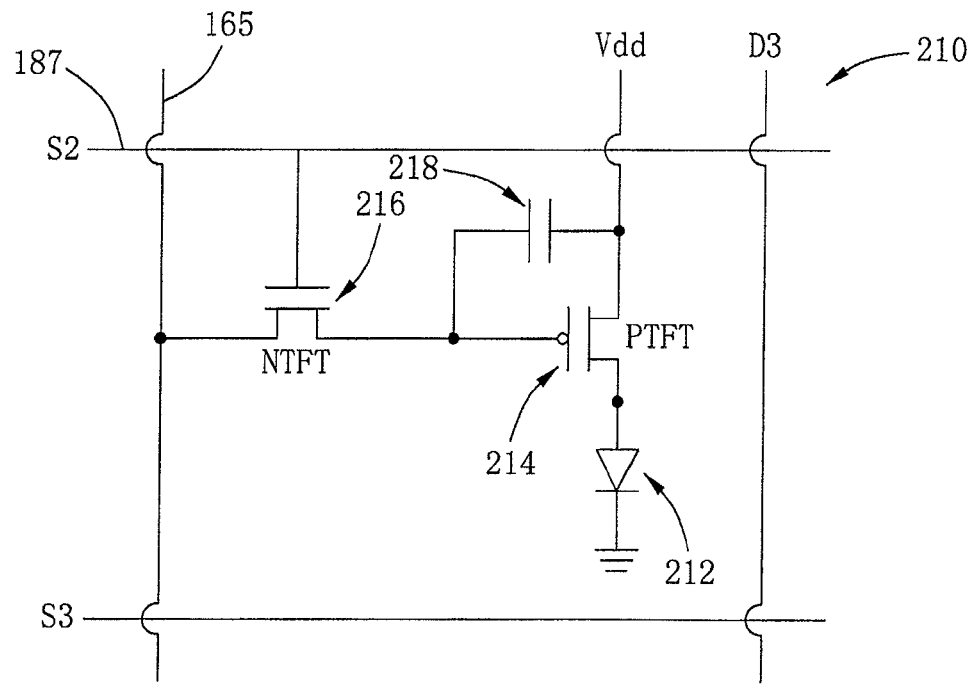
FIG. 2 schematically shows a basic circuit structure of a sub-pixel.

The sub-pixel can be designed to contain several TFTs. Generally, each sub-pixel comprises at least a driving TFT for driving a light emitting element and a switch TFT for switching the state of the sub-pixel, as shown in FIG. 2. FIG. 2 schematically shows a basic circuit structure of the sub-pixel 210 in FIG. 1. The sub-pixel 210 has a light emitting element 212 such as an OLED, and a driving TFT 214, which is generally implemented by a PTFT, for driving the light emitting element 212. The sub-pixel 210 further has a switch TFT 216, which is generally implemented by an NTFT, and a capacitor 218. The switch TFT 216 has a gate thereof electrically coupled to the corresponding scan line 187, a drain thereof electrically coupled to the corresponding data line 165, and a source thereof connected with a terminal of the capacitor 218 and a gate of the driving TFT 214. The capacitor 218 has the other terminal thereof connected to a source of the driving TFT 214 and a voltage source Vdd. The driving TFT 214 is connected with the light emitting element 212. The operation of such a circuit is widely known in this field and is not the key point of the present invention, and therefore the description thereof is omitted herein.

According to the discussion above, the requirement of uniformity for the driving TFT of each sub-pixel in the display panel is very strict so as to avoid luminance mura occurring in the display area. The requirement of electrical performance is very high for the switch TFT for switching the sub-pixel state and the peripheral circuit TFTs. In other words, for an AMOLED display, the requirements for the driving TFT and switch TFT, peripheral circuit TFT are different. The present invention provides a technique so that TFTs meeting different requirements can be manufactured in the same process.

In an embodiment of the present invention, the N-type TFT and P-type TFT used in the OLED display peripheral circuit, the switch TFT, which is usually implemented by an NTFT and is used in the display area, and the driving TFT, which is usually implemented by a PTFT for driving the light emitting element in the display area are simultaneously manufactured in different regions of the same glass substrate. For the sake of description convenience, the NTFT, PTFT used in the peripheral circuit and the switch TFT used in the display area are generally called "non-driving TFTs". According to the embodiment of the present invention, the non-driving TFT and the driving TFT are manufactured to have different properties which meet the different requirements. The non-driving TFT has excellent electrical performance, while the driving TFT is able to cause the resultant flat display to have good luminance uniformity.

The process of the AMOLED display TFT manufacturing method of the present invention is shown in FIG. 3 to FIG. 12. In each drawing, the left portion of a first region shows a process for an N-type non-driving TFT, and the right portion shows a process for a P-type non-driving TFT. A second region shows a process for the driving TFT.

Figure 3:
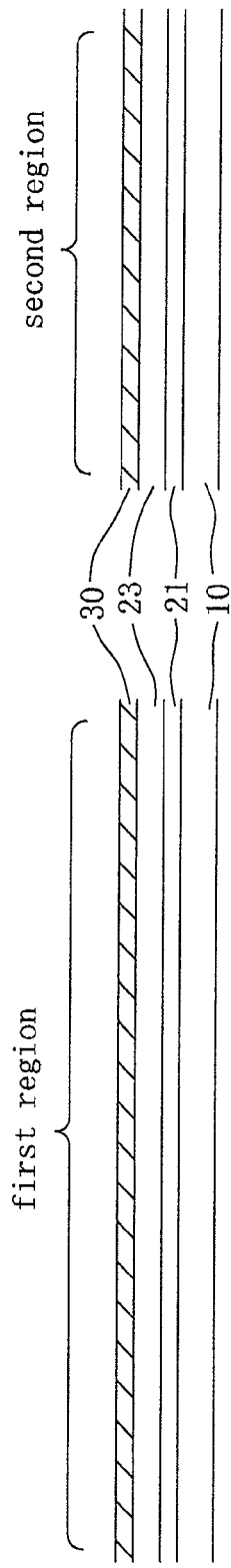

FIG. 3 illustrates the first step of the method in accordance with an embodiment of the present invention. A substrate 10 is provided, the material thereof can be light transparent material such as glass. A buffer layer is formed on the substrate 10. In the present embodiment, the buffer layer comprises a nitride layer 21, of which the material can be silicon nitride, and an oxide layer 23, of which the material can be silicon oxide. An amorphous silicon layer is formed on the buffer layer and then is converted into a first poly-silicon layer 30 by using a first crystallization process. The first crystallization process is a high power laser crystallization process, which is referred to as a standard laser crystallization process. For example, an excimer laser anneal (ELA) method can be used.

Figure 4:
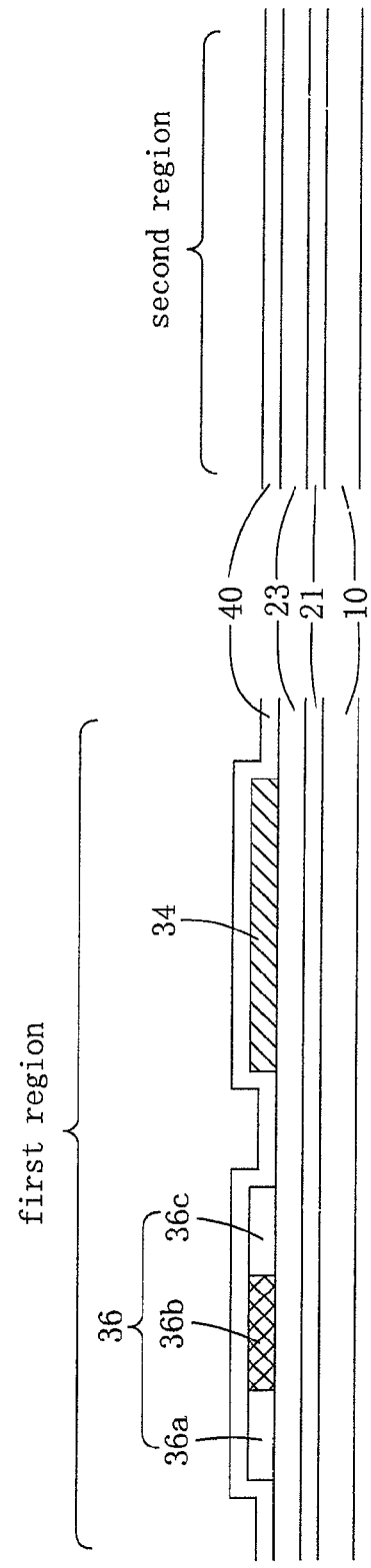

With reference to FIG. 4, the first poly-silicon layer 30 is patterned and subject to n-doping and channel doping. In the NTFT portion, the remaining poly-silicon layer is used as an active area 36, which is further formed to have a drain 36a, a channel 36b and a source 36c. In the PTFT portion, the remaining poly-silicon layer is used as an active area 34. At this time, the active area 34 of the PTFT has not been doped. It is noted that the poly-silicon layer 30 in the second region is entirely removed by any suitable technique such as dry etching. Successively, a first insulating layer 40 is formed over the whole structure. According to various embodiments, the thickness of the first insulating layer 40 is as thin as possible. In practice, the thickness of the first insulation layer 40 is about 200 to 300 angstrom. In the present embodiment, the material of the first insulating layer 40 is oxide such as silicon oxide. According to various embodiments, the material of the first insulating layer 40 can be the same as that of the oxide layer 23 of the buffer layer.

Figure 5:
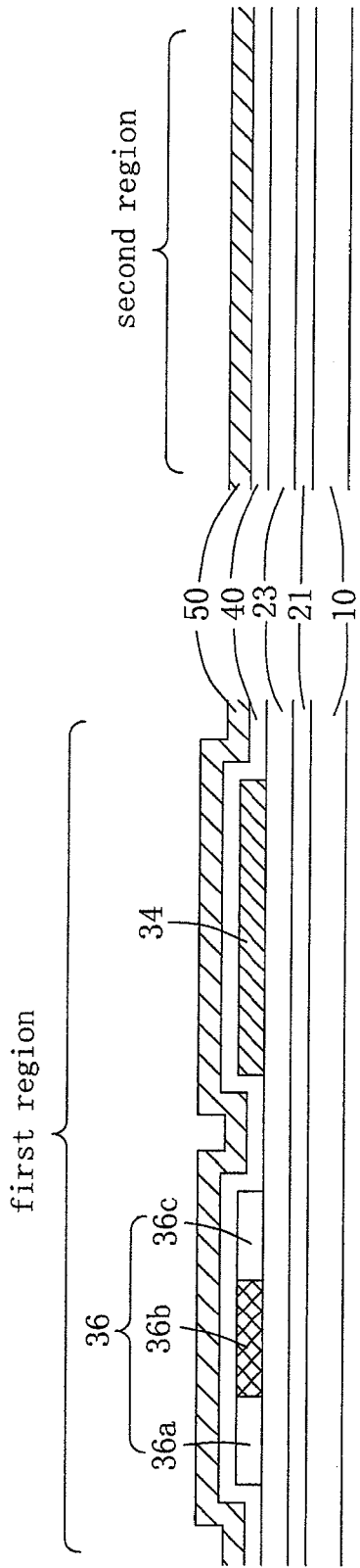
Figure 6:
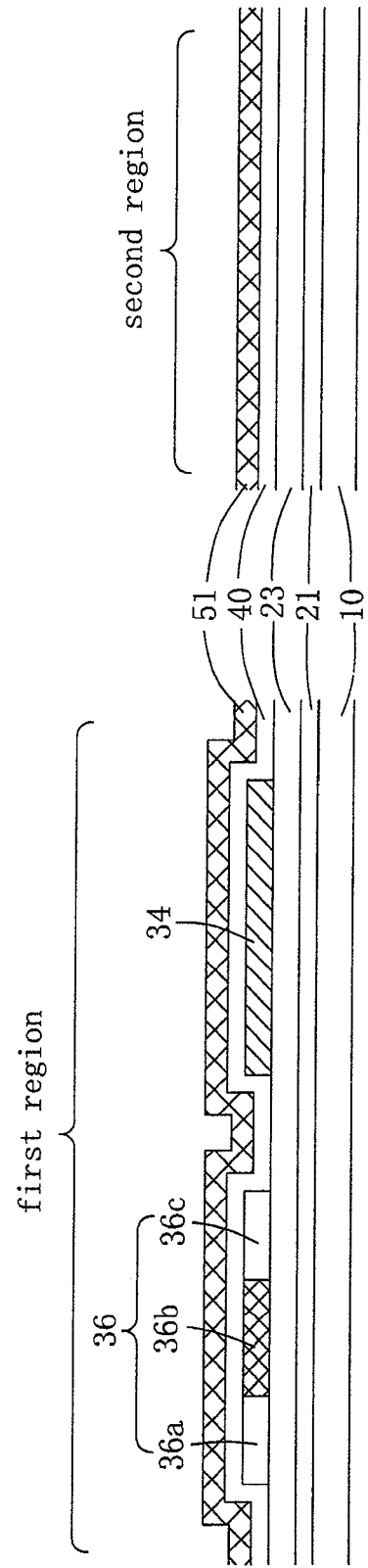

With reference to FIG. 5, an amorphous silicon layer 50 is formed on the structure of FIG. 4. This amorphous silicon layer 50 is converted into poly-silicon (i.e. a second poly-silicon layer 51 shown in FIG. 6) by using a second crystallization process. According to the present invention, the second crystallization process is different from the first crystallization process. The second crystallization process utilizes a non-laser crystallization technique or a low power laser crystallization technique. The non-laser crystallization technique can be any of solid phase crystallization (SPC), metal induced crystallization (MIC), metal induced lateral crystallization (MILC), filed enhanced metal induced lateral crystallization (FE-MILC), field enhanced rapid thermal annealing process, furnace annealing process, rapid thermal process (RTP) and so on. The low power laser crystallization process can be any of lower power excimer laser crystallization, solid state laser crystallization and so on. The respective crystallization processes listed here are only for exemplarity. The invention is not limited hereby.

Figure 7:
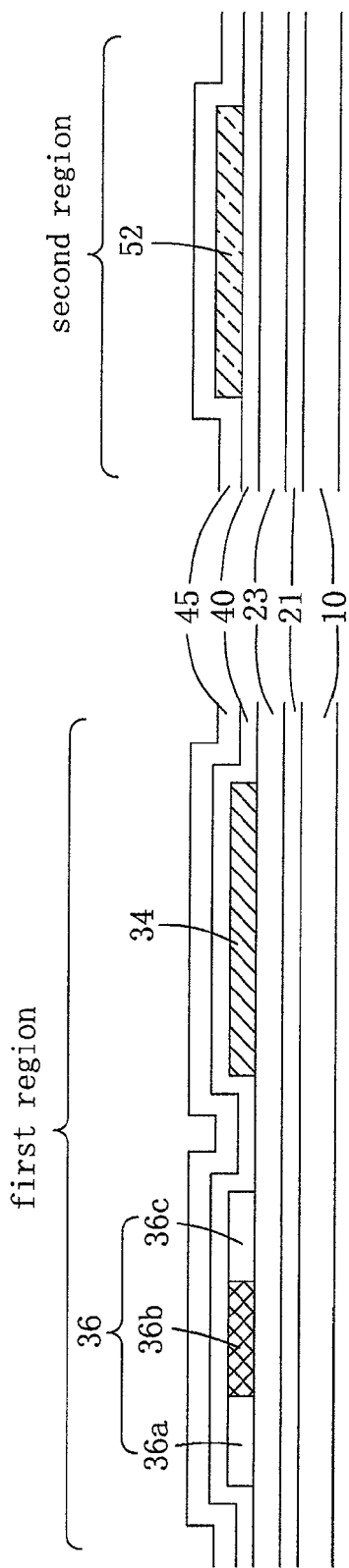
Figure 8:
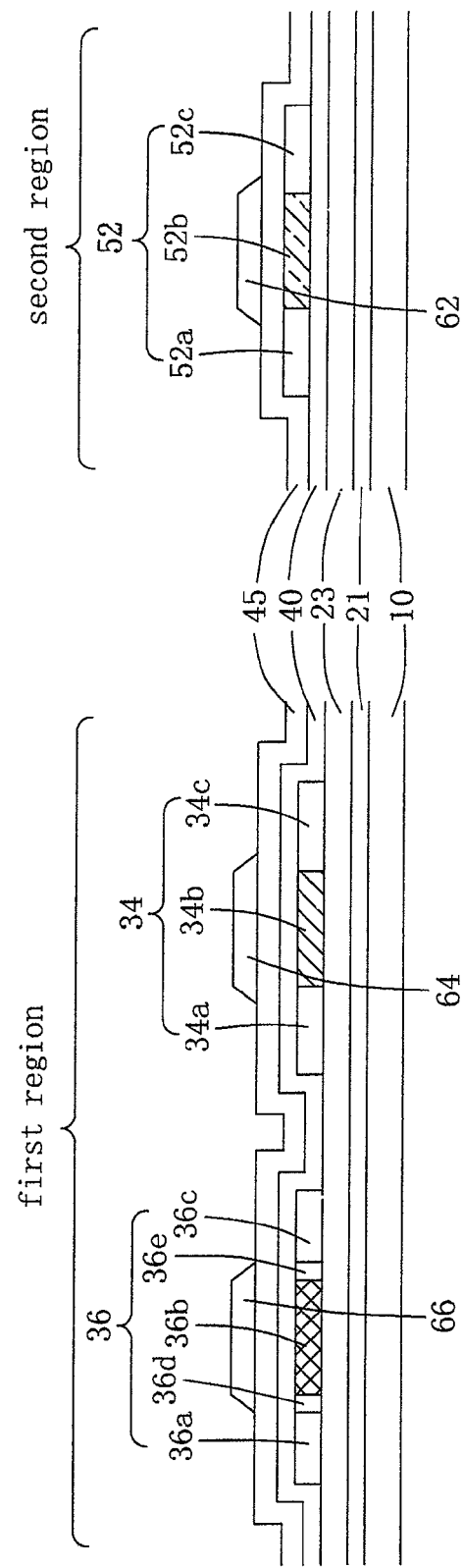

With reference to FIG. 7, after patterning, the second poly-silicon layer 51 in the first region is removed, while a portion of the second poly-silicon layer 51 in the second region is left as an active area 52. A second insulating layer 45 is formed over the whole structure. The material of the second insulating layer 45 can be oxide as the first insulating layer 40. However, for further enhancing electrical performance, the insulating layer 45 of the present embodiment is formed to include a lower oxide layer and an upper nitride layer. In practice, it is difficult to distinguish the second insulating layer 45 and the first insulating layer 40 after the second insulating layer 45 is formed.

As can be seen from the drawing, the thickness of the insulating material from the bottom of the active area 52 to the top of the substrate 10 in the second region (including the nitride layer 21, oxide layer 23 and first insulating layer 40) is thicker than that of the insulating material from the bottom of the active areas 34, 36 to the top of the substrate 10 in the first region (including nitride layer 21 and oxide layer 23 but without the first insulating layer 40). In contrast, the insulating material between the gate 62 and the active area 52 in the second region includes only the second insulating layer 45. The insulating material between the gates 64, 66 and the active areas 34, 36 in the first region includes the first insulating layer 40 and the second insulation layer 45. The insulating material between the gates 64, 66 and the active areas 34, 36 in the first region is referred to as a first gate insulation layer, and the insulating material between the gate 62 and the active area 52 in the second region is referred to as a second gate insulation layer. The second gate insulation layer is thinner than the first gate insulation layer. The thickness difference between the first and second gate insulation layers is the thickness of the first insulating layer 40. Taking errors of the respective film thicknesses into consideration) the mentioned thickness difference should be greater than 30 angstrom in general.

With reference to FIG. 9, portions 34a, 34c of the active area in the first region and portions 52a, 52c of the active area in the second region are subject to P-doping so as to form drains 34a', 52a' and sources 34c', 52c'.

With reference to FIG. 10, a first protection layer 70 and a second protection layer 80 are formed over the structure of FIG. 9. In addition, electrodes 92, 94, 96 are formed in any suitable manner. The material of the first protection layer 70 can be nitride, and the material of the second protection layer 80 can be oxide.

Figure 11:
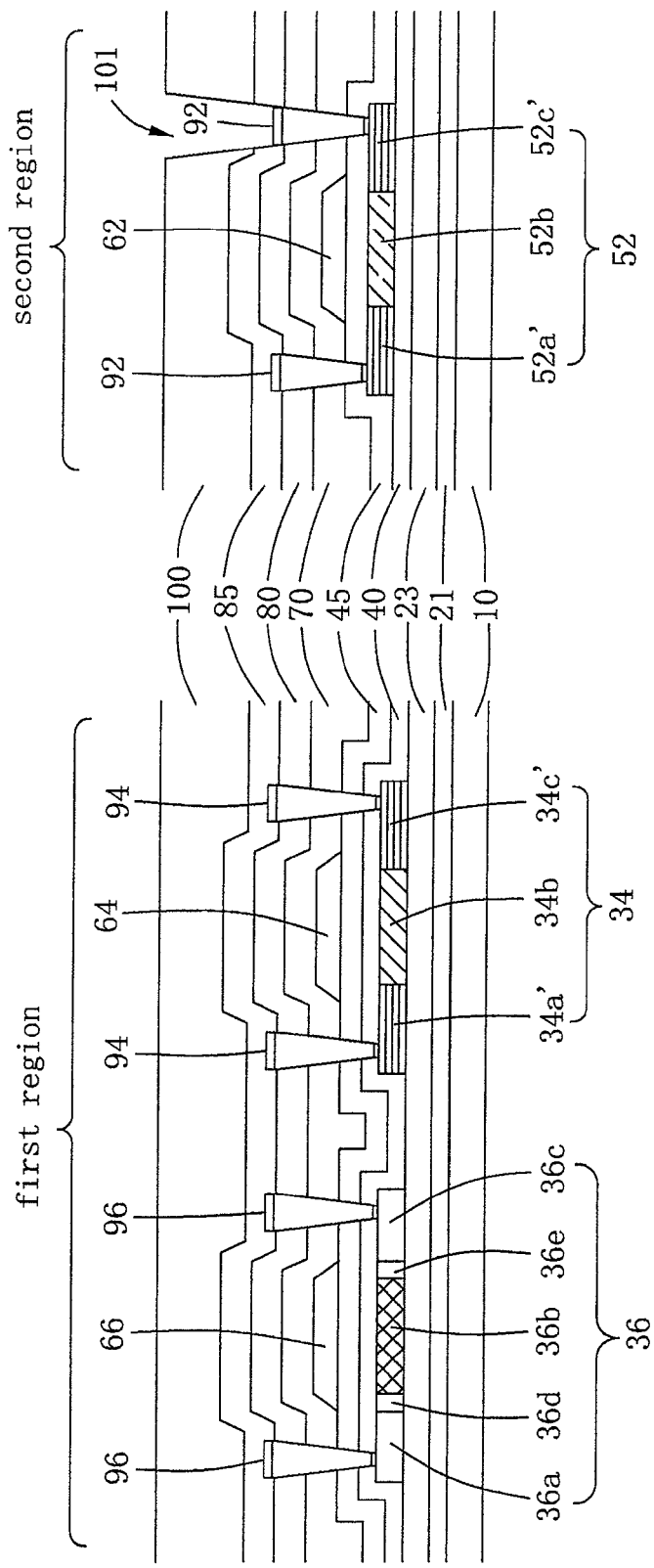

With reference to FIG. 11, an intermediate layer 85, of which the material can be nitride, is formed over the structure of FIG. 10. Then a first planarizing layer 100 is formed over the whole structure so that the surface of the whole structure becomes flat. The material of the first planarizing layer 100 can be transparent material. As shown, a contact hole 101 is formed by any suitable method.

Figure 12:
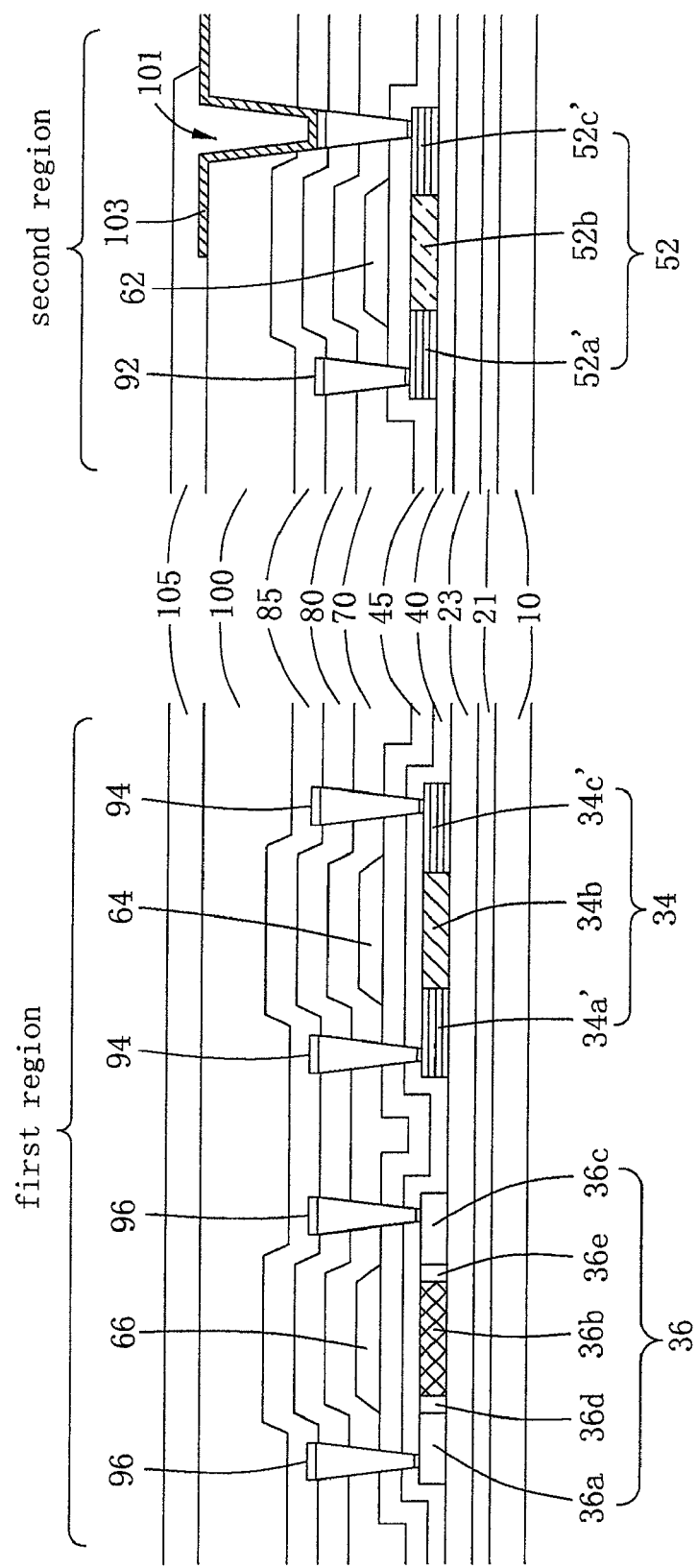

With reference to FIG. 12, an anode 103 of an OLED is formed on the sidewall of the contact hole 101. In addition, a second planarizing layer 105 is formed.

The poly-silicon layer of the active area 52 in the second region is used in the driving TFT for driving the light emitting element, while the poly-silicon layers of the active areas 34, 36 in the first region are used in the non-driving NTFT and PTFT (e.g. peripheral circuit TFT and switch TFT). The former and latter are induced to crystallize by using different crystallization methods, that is, the first crystallization process and the second crystallization process. The first crystallization process can be the standard laser crystallization method such as ELA. The second crystallization process can be the non-laser crystallization method such as SPC or the low power (low temperature) laser crystallization method such as low power excimer laser crystallization method. The poly-silicon layers generated by using these two different crystallization processes appear significant difference in grain properties.

Figure 13:
FIG. 13 shows a poly-silicon grain structure formed by an FE-RTA crystallization method.
Figure 14:
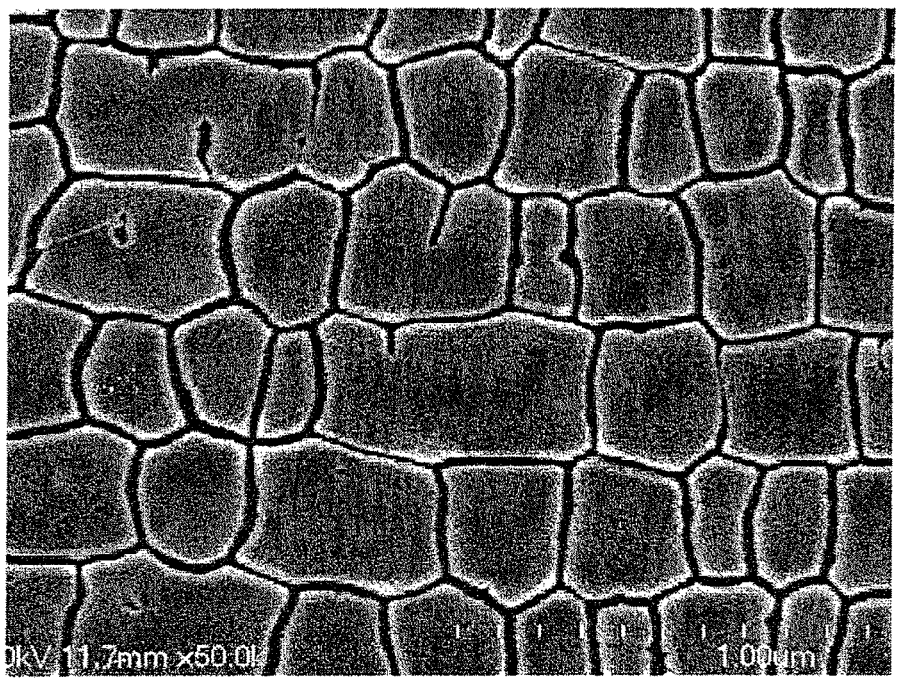
FIG. 14 shows a poly-silicon grain structure formed by an ELA crystallization method.

FIG. 13 shows a poly-silicon grain structure formed by an FE-RTA crystallization method, which is a non-laser crystallization method. As can be seen, grains formed by such a method are small and the arrangement thereof is irregular. The texture is disordered and has branch-like veins. FIG. 14 shows a poly-silicon grain structure formed by an ELA crystallization method, which is a standard laser crystallization method. As can be seen, grains formed by this method are bigger, and the arrangement thereof is more regular. The texture thereof is ordered as a column texture and has no branch-like veins.

In general, the grains formed by the standard laser crystallization method and the low power laser crystallization method may be different in size up to 500 angstrom.

By using the poly-silicon layers made by the standard crystallization method to form the active areas of the peripheral circuit TFTs, excellent electric performance can be obtained. For example, the poly-silicon formed by the standard laser crystallization method has high carrier mobility such as 100 cm$^2$/V·s or larger than 100 cm$^2$/V·s. However, variation of carrier mobility for such poly-silicon is greater. That is, standard deviation of carrier mobility for such poly-silicon is high. The poly-silicon used in the driving TFT, for which the requirement of electric performance is not so critical, is formed by the non-laser crystallization method or low power laser crystallization method rather than the standard laser crystallization method so that the strip mura can be avoided after the display using the driving TFT is fabricated. The poly-silicon formed by the non-laser crystallization method or low power laser crystallization method has a lower carrier mobility, which is about 10-40 cm$^2$/V·s. Accordingly, such poly-silicon is not suitable for being used to manufacture the peripheral circuit TFT and switch TFT. However, such carrier mobility is sufficient for the driving TFT for driving the OLED. The driving TFT using the latter poly-silicon has a low carrier mobility standard deviation, that is, the variation is less, the stability is higher. Therefore, the strip mura can be effectively reduced after the display using the driving TFT is fabricated.

Figure 15:
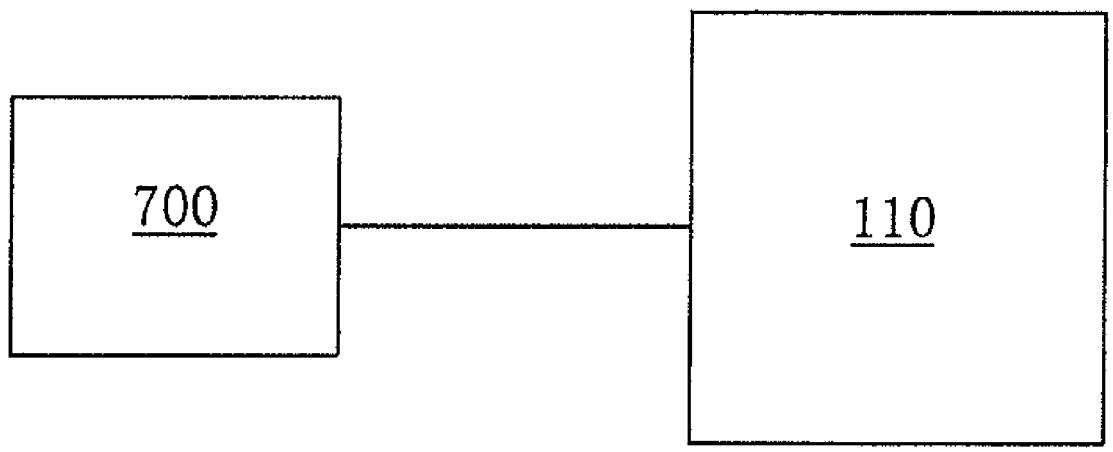
FIG. 15 is a schematic block diagram showing an electronic device including the OLED display in accordance with an embodiment of the present invention.

FIG. 15 is a schematic block diagram showing an electronic device 600 including the OLED display 110 in accordance with an embodiment of the present invention. The OLED display 110, which has the driving TFT, switch TFT and peripheral circuit TFT as shown in FIG. 12, can be a part of the electronic device 600. The electric device 600 comprises the OLED display 110 and a power supply 700. The power supply 700 is coupled to the OLED display 110 to power the OLED display 110, so that the OLED display can generate images. The electronic device 600 can be a mobile phone, digital camera, PDA, notebook, desk-top computer, television set, satellite navigation device, vehicle display or portable DVD player.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. An organic light emitting diode (OLED) display, having a peripheral circuit and a display area, said display area including a plurality of sub-pixels, each sub-pixel having a light emitting element, said OLED display comprising:

a substrate having a first region and a second region;

first thin film transistors (TFTs) formed on said first region of said substrate, each first TFT comprising a first buffer layer formed on said substrate, an active area formed by a first poly-silicon layer provided on said first buffer layer, a first gate insulation layer covering said active region and a first gate provided on said first gate insulation layer; and a second TFT formed on said second region of said substrate, said second TFT comprising a second buffer layer formed on said substrate, an active area formed by a second poly-silicon layer provided on said second buffer layer, a second gate insulation layer covering said active area and a second gate provided on said second gate insulation layer, wherein said first poly-silicon layer and said second poly-silicon layer have different grain properties, and said first gate insulation layer and said second gate insulation layer have different thicknesses.

2. The OLED display of claim 1, wherein said first TFTs comprise peripheral circuit TFTs used in said peripheral circuit and a switch TFT for switching a state of said sub-pixel, while said second TFT comprises a driving TFT for driving said light emitting element.

3. The OLED display of claim 2, wherein said first poly-silicon layer and said second poly-silicon layer have different grain structures.

4. The OLED display of claim 3, wherein said first poly-silicon layer has a column texture in which a grain arrangement thereof is more regular, while said second poly-silicon layer has a texture in which a grain arrangement thereof is irregular and has branch-like veins.

5. The OLED display of claim 4, wherein said first poly-silicon layer and said second poly-silicon layer have different grain sizes.

6. The OLED display of claim 5, wherein said first poly-silicon layer and second poly-silicon layer have grain sizes differing from each other by a difference no less than 500 angstrom on the average.

7. The OLED display of claim 2, wherein a carrier mobility standard deviation of said peripheral circuit TFT is greater than that of said driving TFT.

8. The OLED display of claim 1, wherein a thickness difference between said first gate insulation layer and said second gate insulation layer is greater than 30 angstrom.

9. The OLED display of claim 1, wherein said OLED display is a part of an electric device, and said electronic device comprises a power supply coupled with said OLED display for powering said OLED display, and wherein said electronic device is a mobile phone, digital camera, PDA, notebook, desk-top computer, television set, satellite navigation device, vehicle display or portable DVD player.

* * * * *